United States Patent
Hsieh et al.

(10) Patent No.: US 7,180,350 B2
(45) Date of Patent: *Feb. 20, 2007

(54) HYBRID LATCH FLIP-FLOP

(75) Inventors: Tsau Hua Hsieh, Miao-Li (TW); Jia-Pang Pang, Miao-Li (TW)

(73) Assignee: Innolux Display Corp., Miao-Li (TW)

( * ) Notice: Subject to any disclaimer, the term of this patent is extended or adjusted under 35 U.S.C. 154(b) by 5 days.

This patent is subject to a terminal disclaimer.

(21) Appl. No.: 11/074,446

(22) Filed: Mar. 7, 2005

(65) Prior Publication Data

US 2005/0195007 A1    Sep. 8, 2005

(30) Foreign Application Priority Data

Mar. 6, 2004    (CN) .................. 2004 1 0026470

(51) Int. Cl.
  *H03K 3/00* (2006.01)
(52) U.S. Cl. ...................... 327/218; 327/208
(58) Field of Classification Search ............ 327/208, 327/218, 210–212
  See application file for complete search history.

(56) References Cited

U.S. PATENT DOCUMENTS

| | | | | |
|---|---|---|---|---|
| 5,126,594 A | * | 6/1992 | Shaik et al. | 327/78 |
| 5,619,157 A | * | 4/1997 | Kumata et al. | 327/203 |
| 5,672,990 A | * | 9/1997 | Chaw | 327/176 |
| 6,229,360 B1 | * | 5/2001 | Mizuno et al. | 327/199 |
| 6,617,902 B2 | * | 9/2003 | Tokumasu et al. | 327/211 |
| 6,937,079 B1 | * | 8/2005 | Zhao et al. | 327/200 |
| 2005/0195008 A1 | * | 9/2005 | Hsieh et al. | 327/218 |

OTHER PUBLICATIONS

H. Partovi, R. Burd, U. Salim, F. Webber, L. Digregorio, and D. Draper "Flow-through latch and edge-triggered flip-flop hybrid elements", in ISSCC Dig. Tech. Papers, Feb. 1996, pp. 138-139.

* cited by examiner

*Primary Examiner*—Long Nguyen
(74) *Attorney, Agent, or Firm*—Wei Te Chung

(57) ABSTRACT

A hybrid latch flip-flop is applied to an LCD. The hybrid latch flip-flop includes a positive pulse generation unit, a latch flip-flop, and a buffer unit. The latch flip-flop includes a sampling unit and a hold unit. One feature of the present invention is that fewer transistors are employed in the hybrid latch flip-flop, which gives rise to low power consumption. Another feature of the present invention is that, by employing the positive pulse generation unit of a double edge trigger type, the data processing capacity of the hybrid latch flip-flop is doubled without changing the clock frequency.

12 Claims, 8 Drawing Sheets

HYBRID LATCH FLIP-FLOP

BACKGROUND OF THE INVENTION

1. Field of the Invention

The present invention relates to a flip-flop. In particular, the present invention relates to a hybrid latch flip-flop.

2. Prior Art

The TFT-LCD is now gradually becoming a standard output apparatus for various digital products. However, the TFT-LCD still needs a proper driving circuit to let it work stably.

In general, the driving circuit of a TFT-LCD can be divided into two parts, one is the source driving circuit and the other is the gate driving circuit. The source electrode in the TFT-LCD is used for controlling the gray level of each pixel unit of the TFT. The gate electrode driving circuit is used for controlling the scanning of each pixel unit. These two kinds of driving circuits both apply shift registers as core circuit units. Latch units and flip-flops are the common choice for use as the shift registers. There are many kinds of flip-flops, such as the SR flip-flop, the JK flip-flop, the D flip-flop, and the T flip-flop. In these kinds of flip-flops, the D flip-flop is commonly used as the shift register. That is to say, the D flip-flop is always used as the core circuit unit in the TFT-LCD driving circuit.

However, the D flip-flop according to the prior art still has many disadvantages. It has a long transition period and easily shifts the clock period. For this reason, people skilled in the art have developed a hybrid latch flip-flop for solving the above problems.

Referring to FIG. 11, a hybrid latch flip-flop is disclosed by H. Partovi, R. Burd, U. Salim, F. Webber, L. DiGregorio, and D. Draper in "Flow-through latch and edge-triggered flip-flop hybrid elements", published in ISSCC Dig. Tech. Papers, February 1996, pp. 138–139. The hybrid latch flip-flop 100 according to the prior art comprises a clock input 101, an inverter unit 110, a latch flip-flop 130, a buffer unit 150, a data input 103, and a data output 105. The latch flip-flop 130 comprises a data sample unit 140 and a data hold unit 149.

The inverter unit 110 comprises a first inverter 111, a second inverter 112, and a third inverter 113. The input of the first inverter 111 is connected to the clock input 101. The output of the first inverter 111 is connected to the input of the second inverter 112. The output of the second inverter 112 is connected to the input of the third inverter 113. The output of the third inverter 113 is connected to the latch flip-flop 130.

The data sample unit 140 comprises four PMOS type transistors and six NMOS type transistors. The four PMOS type transistors comprise a first PMOS type transistor 131, a second PMOS type transistor 132, a third PMOS type transistor 133, and a fourth PMOS type transistor 134. The six NMOS type transistors comprise a first NMOS type transistor 141, a second NMOS type transistor 142, a third NMOS type transistor 143, a fourth NMOS type transistor 144, a fifth NMOS type transistor 145, and a sixth NMOS type transistor 146. The sources of the four PMOS type transistors are connected to a power source 104. The gate of the first PMOS type transistor 131, the gate of the first NMOS type transistor 141, and the gate of the fourth NMOS type transistor 144 all are connected to the clock input 101. The gate of the second PMOS type transistor 132 and the gate of the second NMOS type transistor 142 all are connected to the data input 103. The output of the third inverter 113 is connected to the gate of the third NMOS type transistor 143, the gate of the sixth NMOS type transistor 146, and the gate of the third PMOS type transistor 133. The drain of the first PMOS type transistor 131 is connected to the drain of the first NMOS type transistor 141, the drain of the second PMOS type transistor 132, the drain of the third PMOS type transistor 133, the gate of the fourth PMOS type transistor 134, and the gate of the fifth NMOS type transistor 145. The source of the first NMOS type transistor 141 is connected to the drain of the second NMOS type transistor 142. The source of the second NMOS type transistor 142 is connected to the drain of the third NMOS type transistor 143. The drain of the fourth PMOS type transistor 134 is connected to the drain of the fourth NMOS type transistor 144. The source of the fourth NMOS type transistor 144 is connected to the drain of the fifth NMOS type transistor 145. The source of the fifth NMOS type transistor 145 is connected to the drain of the sixth NMOS type transistor 146. The source of the third NMOS type transistor 143 and the source of the sixth NMOS type transistor are connected to ground (0 volts).

The data hold unit 149 comprises a fourth inverter 147 and a fifth inverter 148. The input of the fourth inverter 147 and the output of the fifth inverter 148 are connected to the drain of the fourth PMOS type transistor 134. The output of the fourth inverter 147 and the input of the fifth inverter 148 are connected to the buffer unit 150.

The buffer unit 150 comprises a sixth inverter 151. The input of the sixth inverter 151 is connected to the output of the fourth inverter 147. The output of the sixth inverter 151 is connected to the data output 105.

The clock signal is inputted from the clock input 101. When the clock signal is at low level, the first NMOS type transistor 141 and the fourth NMOS type transistor 144 are placed in a non-conducting state, and the first PMOS type transistor 131 is placed in a conducting state. The three inverters in the inverter unit 110 transform the clock signal from low level to high level. The high level signal places the third NMOS type transistor 143 and the sixth NMOS type transistor 146 in a conducting state, and places the third PMOS type transistor 133 in a non-conducting state. The node V1 shown in FIG. 11 would be charged to high voltage, VDD(whose level is equivalent to the power source 104). The high voltage places the fourth PMOS type transistor 134 in a non-conducting state, and keeps the voltage value of the data output 105.

When the positive edge of the clock signal arrives, the first NMOS type transistor 141 and the fourth NMOS type transistor 144 are placed in a conducting state. The third NMOS type transistor 143 and the sixth NMOS type transistor 146 remain in the conducting state in a delay period which is determined by a delay time of the inverter unit 110. If the data signal from the data input 103 is at low level, the second PMOS type transistor 132 is placed in a conducting state, the node V1 is charged to high voltage, the fifth NMOS type transistor 145 is in a conducting state, and the fourth PMOS type transistor 134 is in a non-conducting state. The source of the fourth PMOS type transistor 134 is connected to ground through the fourth, fifth, and sixth NMOS type transistors 144, 145, 146. On the other hand, if the data signal from the data input 103 goes high, the second NMOS type transistor 142 is placed in a conducting state, the second PMOS type transistor 132 is in a non-conducting state, and the node V1 is connected to ground through the fourth, fifth, and sixth NMOS type transistors 144, 145, 146. Because the node V1 is at low level, the fourth PMOS type transistor 134 is placed in a conducting state, and the fifth NMOS type transistor 145 is in a non-conducting state. The drain of the fourth PMOS type transistor 134 outputs the high voltage to the data hold unit 149. In this period, the latch flip-flop is viewed as placed in a conducting state, and then the data signal from data input can be sampled and hold. Once the node CKDB shown in FIG. 11 turns to low level, the connection between the node V1 and data input is weaker and the latch flip-flop 130 is viewed as in a non-conducting state. After the negative edge of the clock signal arrives, the first PMOS type transistor 131 remains in a conducting state and the node V1 is held at high voltage VDD. The data signal from the data input 103 cannot be sampled.

Referring to FIG. 12, this is a sequence diagram of the hybrid latch flip-flop of FIG. 11. V(D), V(Clock), and V(Q) shown in FIG. 12 respectively represent the waveform diagram of the data input 103, the clock input 101, and the data output 105 of FIG. 11. As shown in FIG. 12, the data output 105 is at low level before Tn. When the positive edge of the clock signal arrives at Tn, the data input 103 is at high level, and this high level would be sampled and output to make the data output 105 change from low to high. Before Tn+1, the data input 103 is at low level, and the data output 105 is at high level. At Tn+1, the data input 103 remains at low level, and this low level is sampled and output to make the data output 105 change from high to low. Before Tn+2, the data input 103 is at low level, and the data output is at low level too. At Tn+2, the low level of the data input 103 is sampled and the data output 105 remains at low level. Before Tn+3, the data input 103 is at high level and the data output 105 is at low level. At Tn+3, the high level of the data input 103 is sampled and the data output 105 changes from low to high. Before Tn+4, the data input 103 is at high level and the data output is at high level, too. At Tn+4, the high level of the data input 103 is sampled and the data output 105 remains at high level. Before Tn+5, the data input 103 is at low level and the data output 105 is at high level. At Tn+5, the low level of the data input 103 is sampled and the data output 105 changes from high to low.

When applying the hybrid latch flip-flop of the prior art to the driver circuit of the LCD, each column electrode and row electrode needs an exclusive hybrid latch flip-flop (HLFF) 100. However, the HLFF 100 comprises too many transistors and causes high power consumption in the driver circuit. In order to meet the requirement of low power consumption of the driver circuit, the HLFF applied in the LCD must have lower power consumption. On the other hand, a new HLFF design having the same function but lower power consumption is demanded.

According to the above description, to provide a new HLFF having lower power consumption is necessary.

SUMMARY OF THE INVENTION

An object of the present invention is to provide a hybrid latch flip-flop that has lower power consumption.

In order to achieve the above-mentioned object, a hybrid latch flip-flop (HLFF) in accordance with the present invention includes a clock input, a positive pulse generating unit, a latch flip-flop, a buffer unit, a data input, and a data output. The latch flip-flop includes a sample unit and a hold unit. The clock input is connected to the positive pulse generating unit. The positive pulse generating unit is connected to the sample unit. The sample unit is connected to the hold unit. The hold unit is connected to the buffer unit. The data input is connected to the sample unit. The buffer unit is connected to the data output.

The positive pulse generating unit can be a positive edge trigger type, a negative edge trigger type, and a double edge trigger type. The sample unit includes seven transistors or six transistors.

Compared to the prior art, the advantage of the present invention is that the number of transistors in the sample unit is fewer, thus reducing power consumption. In the present invention, the positive pulse generating unit and the latch flip-flop are used separately, and the positive pulse generating unit is the common circuit in the driver circuit. Although the positive pulse generating unit has more transistors than the inverter unit of the prior art, the total number of transistors in the driver circuit of the present invention is fewer than in the prior art. Thus, the present invention achieves the object of reducing power consumption.

Furthermore, if adopting the double trigger, the data transmitting rate of the HLFF could be doubled compared to the data transmitting rate of the prior art.

Other objects, advantages, and novel features of the present invention will become more apparent from the following detailed description when taken in conjunction with the accompanying drawings, in which:

DETAILED DESCRIPTION OF THE EMBODIMENTS

Figure 1:
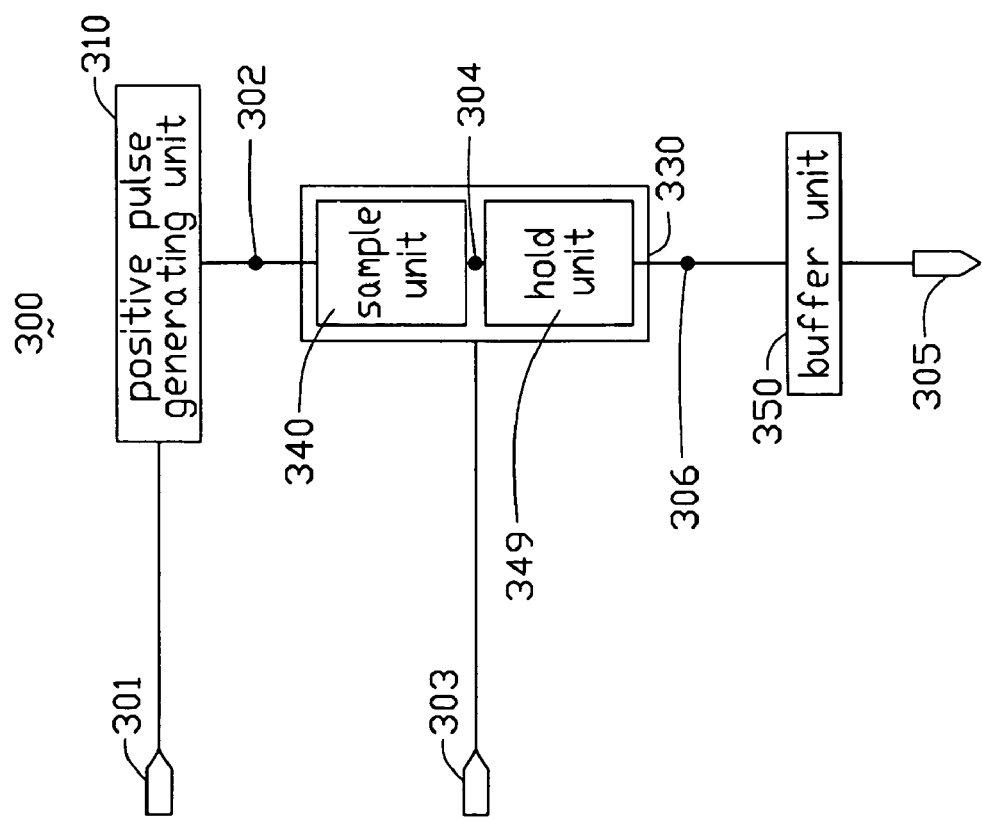
FIG. 1 is a block diagram of a hybrid latch flip-flop according to the preferred embodiment of the present invention, the hybrid latch flip-flop comprising a positive pulse generating unit and a latch flip-flop.

Referring to FIG. 1, this is a block diagram of a hybrid latch flip-flop (HLFF) 300 according to the preferred embodiment of the present invention. The HLFF 300 includes a clock input 301, a positive pulse generating units 310, a latch flip-flop 330, a buffer unit 350, a data input 303, and a data output 305. The latch flip-flop 330 includes a sample unit 340 and a hold unit 349.

The clock input 301 is connected to the positive pulse generating unit 310. The positive pulse generating unit 310 is connected to the sample unit 340. The sample unit 340 is connected to the hold unit 349. The hold unit 349 is connected to the buffer unit 350. The data input 303 is connected to the sample unit 340. The buffer unit 350 is connected to the data output 305.

The positive pulse generating unit 310 receives the clock signal from the clock input 301, and transforms the clock signal to the positive pulse signal. The latch flip-flop 330 receives the positive pulse signal from the node 302. In the latch flip-flop 330, the sample unit 340 receives the data signal from the data input 303, and receives the positive pulse signal from the positive pulse generating unit 310. The sample unit 340 samples the data signal at each peak of the positive pulse signal. For example, at each peak of the positive pulse, if the data signal is at high level, the sample unit would output a high level signal. Otherwise, if the data signal is at low level, the sample unit would output a low level signal. The data signal being sampled would be sent to the hold unit 349 via the node 304. Before the next data sampling, the hold unit 349 would hold the sampled result from the sample unit 340 and output the sampled signal to the buffer unit 350 via the node 306. The buffer unit 350 delays and amplifies the sampled signal to provide a higher driving ability to drive the following circuit. Obviously, the HLFF 300 according to the present invention has the basic function like the conventional flip-flop. The basic function is to sample the data signal and output the sampled signal according to the clock signal. In the HLFF 300 according to the present invention, the positive pulse generating unit 310 includes at least three embodiments, and the latch flip-flop 330 includes at least four embodiments.

Figure 2:
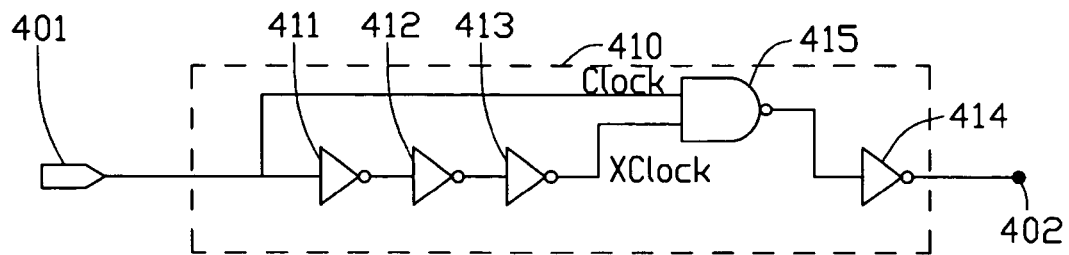
FIG. 2 is a circuit diagram of a first embodiment of the positive pulse generating unit of FIG. 1.

Referring to FIG. 2, this is a circuit diagram of the first embodiment of the positive pulse generating unit of FIG. 1. The positive pulse generating unit 410 includes a first inverter 411, a second inverter 412, a third inverter 413, a fourth inverter 414, and a NAND gate 415. The input of the first inverter 411 is connected to the clock input 401. The output of the first inverter 411 is connected to the input of the second inverter 412. The output of the second inverter 412 is connected to the input of the third inverter 413. The output of the third inverter 413 is connected to one input of the NAND gate 415. The other input of the NAND gate 415 is connected to the clock input 401. The output of the NAND gate 415 is connected to the input of the fourth inverter 414. The output of the fourth inverter 414 is connected to the node 402. The first inverter 411 and the second inverter 412 are used for delaying the clock signal, and the third inverter 413 is used for delaying and inverting the clock signal from the clock input 401. That means the clock signal would be delayed and inverted by the first, second and third inverters 411, 412, 413, and then input to one input of the NAND gate 415. The clock signal from the clock input 401 is also input into the other input of the NAND gate 415. The positive edge or the negative edge is directly input into one input of the NAND gate 415, and the positive edge or the negative edge being delayed and inverted is also input into the other input of the NAND gate 415. After receiving the positive edge of the clock signal and before receiving the delayed negative edge, the NAND gate 415 outputs a negative voltage. These successive negative voltages would be viewed as a negative pulse. The negative pulse would be inverted to a positive pulse by the fourth inverter 414. The positive pulse is output to the node 402. However, after receiving the delayed negative edge of the clock signal and before receiving the positive edge, there would not be any pulse generated.

Figure 3:
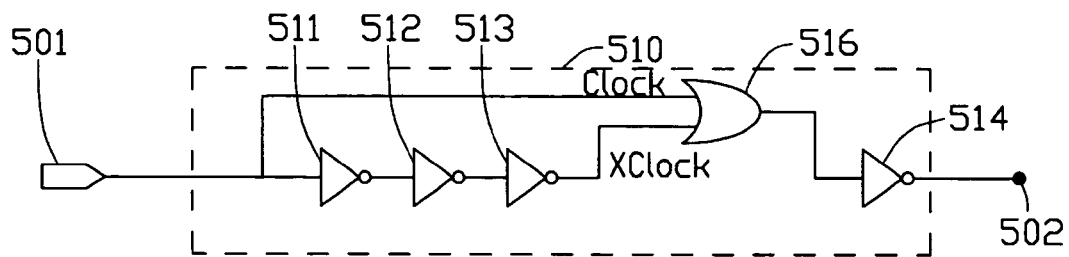
FIG. 3 is a circuit diagram of a second embodiment of the positive pulse generating unit of FIG. 1.

Referring to FIG. 3, this is a circuit diagram of the second embodiment of the positive pulse generating unit of FIG. 1. The positive pulse generating unit 510 includes a first inverter 511, a second inverter 512, a third inverter 513, a fourth inverter 514, and an OR gate 516. The input of the first inverter 511 is connected to the clock input 501. The output of the first inverter 511 is connected to the input of the second inverter 512. The output of the second inverter 512 is connected to the input of the third inverter 513. The output of the third inverter 513 is connected to one input of the OR gate 516. The other input of the OR gate 516 is connected to the clock input 501. The output of the OR gate 516 is connected to the input of the fourth inverter 514. The output of the fourth inverter 514 is connected to the node 502. The first inverter 511 and the second inverter 512 are used for delaying the clock signal, and the third inverter 513 is used for delaying and inverting the clock signal from the clock input 501. That means the clock signal would be delayed and inverted by the first, second and third inverters 511, 512, 513, and then input to one input of the OR gate 516. The clock signal from the clock input 501 is also input into the other input of the OR gate 516. The positive edge or the negative edge is directly input into one input of the OR gate 516, and the positive edge or the negative edge being delayed and inverted is also input into the other input of the OR gate 516. After receiving the negative edge of the clock signal and before receiving the delayed positive edge, the OR gate 516 outputs a negative voltage. These successive negative voltages would be viewed as a negative pulse. The negative pulse would be inverted to a positive pulse by the fourth inverter 514. The positive pulse is output to the node 502. However, after receiving the delayed positive edge of the clock signal and before receiving the negative edge, there would not be any pulse generated.

Figure 4:
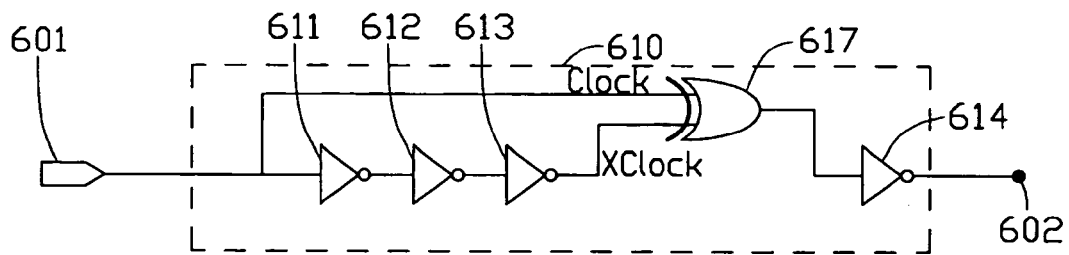
FIG. 4 is a circuit diagram of a third embodiment of the positive pulse generating unit of FIG. 1.

Referring to FIG. 4, this is a circuit diagram of the third embodiment of the positive pulse generating unit of FIG. 1. It must be emphasized that the third embodiment of the positive pulse generating unit 610 adopts the double trigger method, and the data transmitting rate of the HLFF 300 could be double the data transmitting rate without changing the clock frequency. The positive pulse generating unit 610 includes a first inverter 611, a second inverter 612, a third inverter 613, a fourth inverter 614, and an Exclusive OR gate 617. The input of the first inverter 611 is connected to the clock input 601. The output of the first inverter 611 is connected to the input of the second inverter 612. The output of the second inverter 612 is connected to the input of the third inverter 613. The output of the third inverter 613 is connected to one input of the Exclusive OR gate 617. The other input of the Exclusive OR gate 617 is connected to the clock input 601. The output of the Exclusive OR gate 617 is connected to the input of the fourth inverter 614. The output of the fourth inverter 614 is connected to the node 602. The first inverter 611 and the second inverter 612 are used for delaying the clock signal, and the third inverter 613 is used for delaying and inverting the clock signal from the clock input 601. That means the clock signal would be delayed and inverted by the first, second and third inverters 611, 612, 613, and then input to one input of the Exclusive OR gate 617. The clock signal from the clock input 601 is also input into the other input of the Exclusive OR gate 617. The positive edge or the negative edge is directly input into one input of the Exclusive OR gate 617, and the positive edge or the negative edge being delayed and inverted is also input into the other input of the Exclusive OR gate 617. After receiving the negative edge of the clock signal and before receiving the delayed positive edge, or after receiving the positive edge of the clock signal and before receiving the delayed negative edge, the Exclusive OR gate 617 outputs a negative voltage. These successive negative voltages would be viewed as a negative pulse. The negative pulse would be inverted to a positive pulse by the fourth inverter 614. The positive pulse is output to the node 602.

Figure 5:
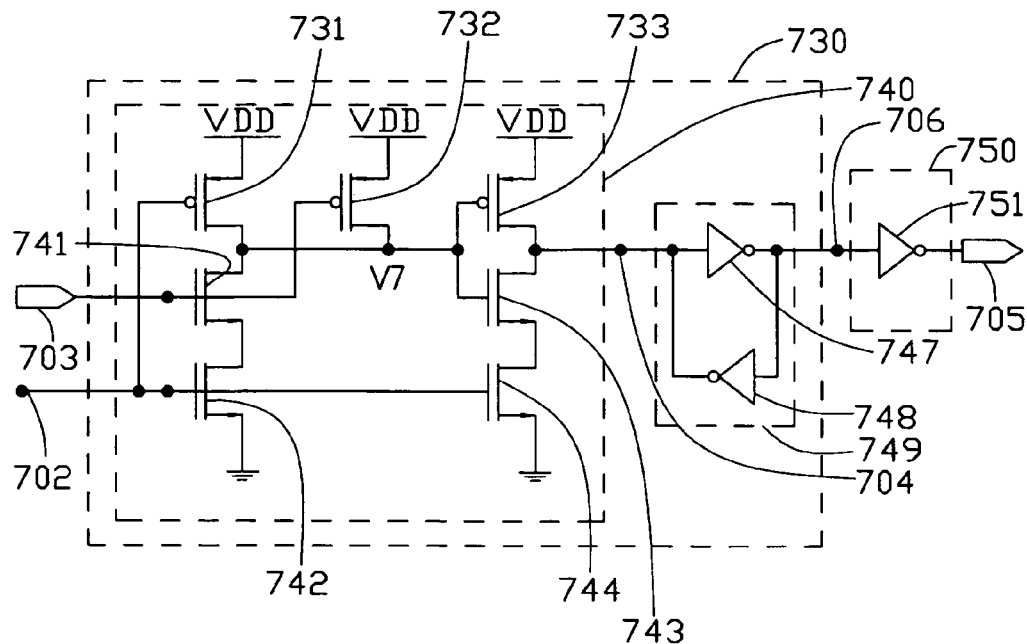
FIG. 5 is a circuit diagram of a first embodiment of the latch flip-flop of FIG. 1.

Referring to FIG. 5, this is a circuit diagram of the first embodiment of the latch flip-flop of FIG. 1. The latch flip-flop 730 comprises a sample unit 740 and a hold unit 749. The sample unit 740 comprises: three PMOS type transistors, which are a first PMOS type transistor 731, a second PMOS type transistor 732, and a third PMOS type transistor 733; and four NMOS type transistors, which are a first NMOS type transistor 741, a second NMOS type transistor 742, a third NMOS type transistor 743, and a fourth NMOS type transistor 744. The hold unit 749 includes a fifth inverter 747 and a sixth inverter 748.

The sources of the three PMOS type transistors 731, 732, 733 are connected to a power source VDD. The gate of the first PMOS type transistor 731, the gate of the second NMOS type transistor 742, and the gate of the fourth NMOS type transistor 744 all are connected to the pulse input 702. The gate of the first NMOS type transistor 741 and the gate of the second PMOS type transistor 732 are both connected to the data input 703. The node V7 is connected to the drain of the first PMOS type transistor 731, the drain of the second PMOS type transistor 732, the gate of the third PMOS type transistor 733, the gate of the third NMOS type transistor 743, and the drain of the first NMOS type transistor 741. The source of the first NMOS type transistor 741 is connected to the drain of the second NMOS type transistor 742. The source of the third NMOS type transistor 743 is connected to the drain of the fourth NMOS type transistor 744. The source of the second NMOS type transistor 742 and the source of the fourth NMOS type transistor 744 are connected to ground (0 volts). The drain of the third PMOS type transistor 733 and the drain of the third NMOS type transistor 743 are connected to the hold unit 749 via the node 704. As shown in FIG. 5, people skilled in the art could easily recognize that the first PMOS type transistor 731, the second PMOS type transistor 732, the first NMOS type transistor 741, and the second NMOS type transistor 742 constitute a NAND gate. The pulse input 702 and the data input 703 are two inputs of the NAND gate, and the node V7 is the output of the NAND gate. If the pulse input 702 is at low level, the node V7 would be at high level whether the data input 703 is at high level or low level. In such conditions, the third PMOS type transistor 733 is placed in a non-conducting state and the third NMOS type transistor 743 is in a conducting state. The pulse input 702 being at low level also places the fourth NMOS type transistor 744 in a non-conducting state, and then the hold unit 749 holds the same data. In addition, if the pulse input 702 is at high level and the data input 703 is at low level, the node V7 would be at high level. Otherwise, if the pulse input 702 is at high level and the data input 703 is also at high level, the node V7 would be at low level. When the node V7 is at high level, the third PMOS type transistor 733 is placed in a non-conducting state and the third NMOS type transistor 743 is in a conducting state. The fourth NMOS type 744 is also in a conducting state and then the hold unit 749 is connected to ground through the node 704, the third NMOS type transistor 743, and the fourth NMOS type transistor 744. This is equal to outputting a low voltage to the hold unit 749. On the other hand, when the node V7 is at low level, the third PMOS type transistor 733 is placed in a conducting state and the third NMOS type transistor 743 is in a non-conducting state. Then, a high voltage would transmit to the hold unit 749. The positive edge of the clock signal would trigger the sample unit 740, and then the data signal from the data input is sampled. The hold unit 749 receives the sampled data signal from the sample unit 740 via the node 704. Before the next data are sampled, the hold unit 749 inverts and holds the sampled data, and then outputs the sampled data to the buffer unit 750 via the node 706.

The buffer unit 750 includes a seventh inverter 751, which is used for inverting the inverted sampled data from the latch flip-flop 730 and the node 706. Then, the inverted sampled data are transformed to the original sampled data. The buffer unit 750 outputs the sampled data to the node 705. That means the buffer unit 750 can provide the function of buffering the output data, and provide the higher driving force to the following circuit.

Figure 6:
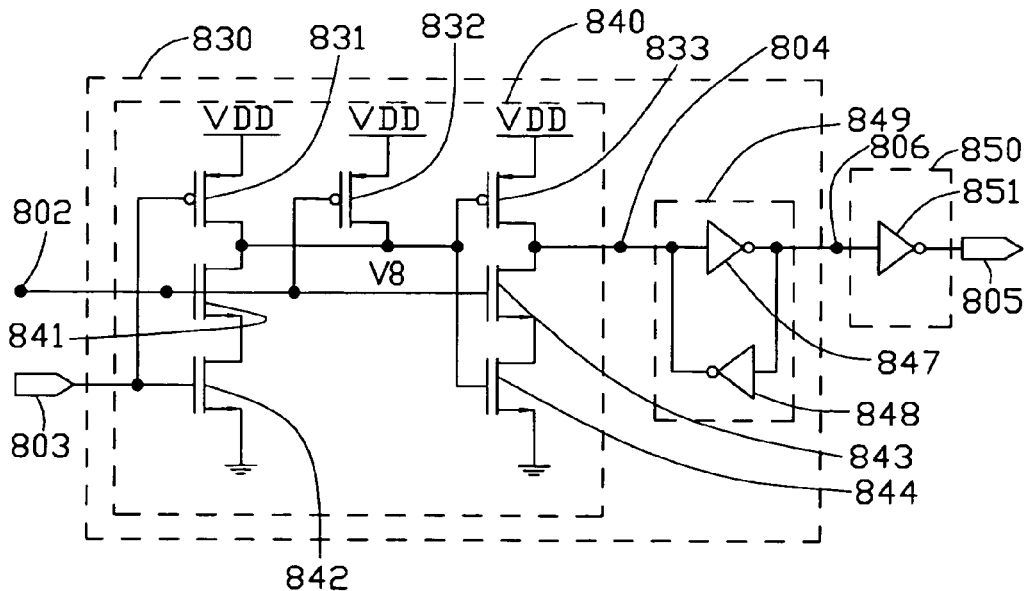
FIG. 6 is a circuit diagram of a second embodiment of the latch flip-flop of FIG. 1.

Referring to FIG. 6, this is a circuit diagram of the second embodiment of the latch flip-flop of FIG. 1. The latch flip-flop 830 comprises a sample unit 840 and a hold unit 849. The sample unit 840 comprises: three PMOS type transistors, which are a first PMOS type transistor 831, a second PMOS type transistor 832, and a third PMOS type transistor 833; and four NMOS type transistors, which are a first NMOS type transistor 841, a second NMOS type transistor 842, a third NMOS type transistor 843, and a fourth NMOS type transistor 844. The hold unit 849 includes a fifth inverter 847 and a sixth inverter 848.

The sources of the three PMOS type transistors 831, 832, 833 are connected to a power source VDD. The gate of the first PMOS type transistor 831 and the gate of the second NMOS type transistor 842 are connected to the data input 803. The gate of the first NMOS type transistor 841, the gate of the second PMOS type transistor 832, and the gate of the third NMOS type transistor 843 are connected to the node 802. The node V8 is connected to the drain of the first PMOS type transistor 831, the drain of the second PMOS type transistor 832, the gate of the third PMOS type transistor 833, the gate of the third NMOS type transistor 843, and the drain of the first NMOS type transistor 841. The source of the first NMOS type transistor 841 is connected to the drain of the second NMOS type transistor 842. The source of the third NMOS type transistor 843 is connected to the drain of the fourth NMOS type transistor 844. The source of the second NMOS type transistor 842 and the source of the fourth NMOS type transistor 844 are connected to ground (0 volts). The drain of the third PMOS type transistor 833 and the drain of the third NMOS type transistor 843 are connected to the hold unit 849 via the node 804. As shown in FIG. 6, people skilled in the art could easily recognize that the first PMOS type transistor 831, the second PMOS type transistor 832, the first NMOS type transistor 841, and a second NMOS type transistor 842 constitute a NAND gate. The node 802 and the data input 803 are two inputs of the NAND gate, and the node V8 is the output of the NAND gate. If the node 802 is at low level, the node V8 would be at high level whether the data input 803 is at high level or low level. In such conditions, the third PMOS type transistor 833 is placed in a non-conducting state and the fourth NMOS type transistor 844 is in a conducting state. The third NMOS type transistor 843 is in a non-conducting state according to the node 802 being at low level, and then the hold unit 849 holds the same data. In addition, if the node 802 is at high level and the data input 803 is at low level, the node V8 would be at high level. Otherwise, if the node 802 is at high level and the data input 803 is also at high level, the node V8 would be at low level. When the node V8 is at high level, the third PMOS type transistor 833 is placed in a non-conducting state and the fourth NMOS type transistor 844 is in a conducting state. The third NMOS type 843 is also in a conducting state, and then the hold unit 849 is connected to ground through the node 804, the third NMOS type transistor 843, and the fourth NMOS type transistor 844. This is equal to outputting a low voltage to the hold unit 849. On the other hand, when the node V8 is at low level, the third PMOS type transistor 833 is placed in a conducting state and the fourth NMOS type transistor 844 is in a non-conducting state. Then, a high voltage would transmit to the hold unit 849. The positive edge of the clock signal would trigger the sample unit 840, and then the data signal from the data input 803 is sampled. The hold unit 849 receives the sampled data signal from the sample unit 840 via the node 804. Before the next data are sampled, the hold unit 849 inverts and holds the sampled data, and then outputs the sampled data to the buffer unit 850 via the node 806.

The buffer unit 850 includes a seventh inverter 851, which is used for inverting the inverted sampled data from the latch flip-flop 830 and the node 806. Then, the inverted sampled data are transformed to the original sampled data. The buffer unit 850 outputs the sampled data to the node 805. That means the buffer unit 850 can provide the function of buffering the output data, and provide the higher driving force to the following circuit.

The sample units 740 and 840 described above each include seven MOS type transistors. Since the sampling process according to the present invention adopts positive pulse signal triggering, the node 802 is mostly at low level and the node V8 is mostly at high level. Thus, in most implementations, adopting only the first PMOS type transistor 831 is good enough, and better than adopting both the first PMOS type transistor 831 and the second PMOS type transistor 832. By this means, the number of transistors in the latch flip-flop is further decreased.

Figure 7:
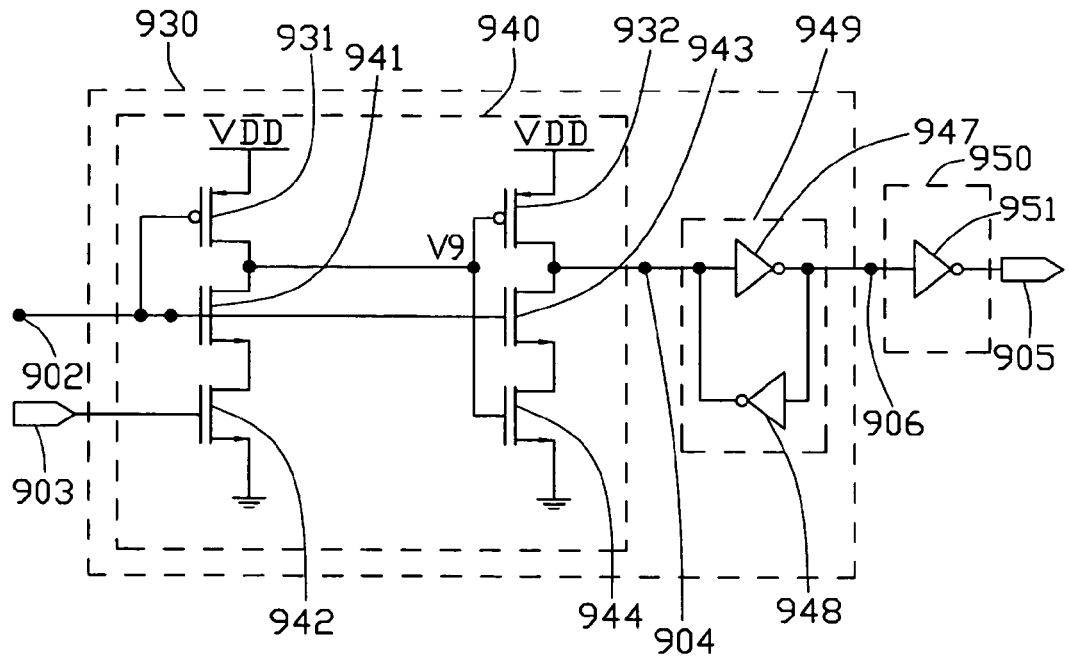
FIG. 7 is a circuit diagram of a third embodiment of the latch flip-flop of FIG. 1.

Referring to FIG. 7, this is a circuit diagram of the third embodiment of the latch flip-flop of FIG. 1. The latch flip-flop 930 comprises a sample unit 940 and a hold unit 949. The sample unit 940 comprises: two PMOS type transistors, which are a first PMOS type transistor 931 and a second PMOS type transistor 932; and four NMOS type transistors, which are a first NMOS type transistor 941, a second NMOS type transistor 942, a third NMOS type transistor 943, and a fourth NMOS type transistor 944. The hold unit 949 includes a fifth inverter 947 and a sixth inverter 948.

The sources of the two PMOS type transistors 931, 932 are connected to a power source VDD. The gate of the first PMOS type transistor 931, the gate of the first NMOS type transistor 941, and the gate of the third NMOS type transistor 943 are connected to the node 902. The gate of the second NMOS type transistor 942 is connected to the data input 903. The node V9 is connected to the drain of the first PMOS type transistor 931, the gate of the second PMOS type transistor 932, the gate of the fourth NMOS type transistor 944, and the drain of the first NMOS type transistor 941. The source of the first NMOS type transistor 941 is connected to the drain of the second NMOS type transistor 942. The source of the third NMOS type transistor 943 is connected to the drain of the fourth NMOS type transistor 944. The source of the second NMOS type transistor 942 and the source of the fourth NMOS type transistor 944 are connected to ground (0 volts). The drain of the second PMOS type transistor 932 and the drain of the third NMOS type transistor 943 are connected to the hold unit 949 via the node 904. If the node 902 is at low level, the first PMOS type transistor 931 is placed in a conducting state, the first NMOS type transistor 941 is in a non-conducting state, and the third NMOS type transistor 943 is in a non-conducting state. That causes the node V9 to be successively charged to a high level. When the node V9 is at high level, the second PMOS type transistor 932 is placed in a non-conducting state and the fourth NMOS type transistor 944 is in a conducting state. Then, the hold unit 949 holds the same data. When the node 902 is at high level, the first PMOS type transistor 931 is placed in a non-conducting state, the first NMOS type transistor 941 is in a conducting state, and the third NMOS type transistor 943 is in a conducting state. If the data input 903 is at low level at that moment, the second NMOS type transistor 942 would be placed in a non-conducting state. Assuming that the node V9 remains at high level, the fourth NMOS type transistor 944 would be placed in a conducting state for a period. The hold unit 949 is connected to ground through the node 904, the third NMOS type transistor 943, and the fourth NMOS type transistor 944. The equivalent is to output a low voltage to the hold unit 949. If the data input 903 is at high level, the second PMOS type transistor 932 is placed in a conducting state. The node V9 is connected to ground via the first NMOS type transistor 941 and the second NMOS type transistor 942. Thus, the fourth NMOS type transistor 944 is placed in a non-conducting state and the second PMOS type transistor 932 is in a conducting state. The node 904 is successively charged to a high level, and outputs the high voltage to the hold unit 949 through the second PMOS type transistor 932. The positive edge of the clock signal would trigger the sample unit 940, and then the data signal from the data input 903 is sampled. The hold unit 949 receives the sampled data signal from the sample unit 940 via the node 904. Before the next data are sampled, the hold unit 949 inverts and holds the sampled data, and then outputs the sampled data to the buffer unit 950 via the node 906.

The buffer unit 950 includes a seventh inverter 951, which is used for inverting the inverted sampled data from the latch flip-flop 930 and the node 906. Then, the inverted sampled data are transformed to the original sampled data. The buffer unit 950 outputs the sampled data to the node 905. That means the buffer unit 950 can provide the function of buffering the output data, and provide the higher driving force to the following circuit.

Figure 8:
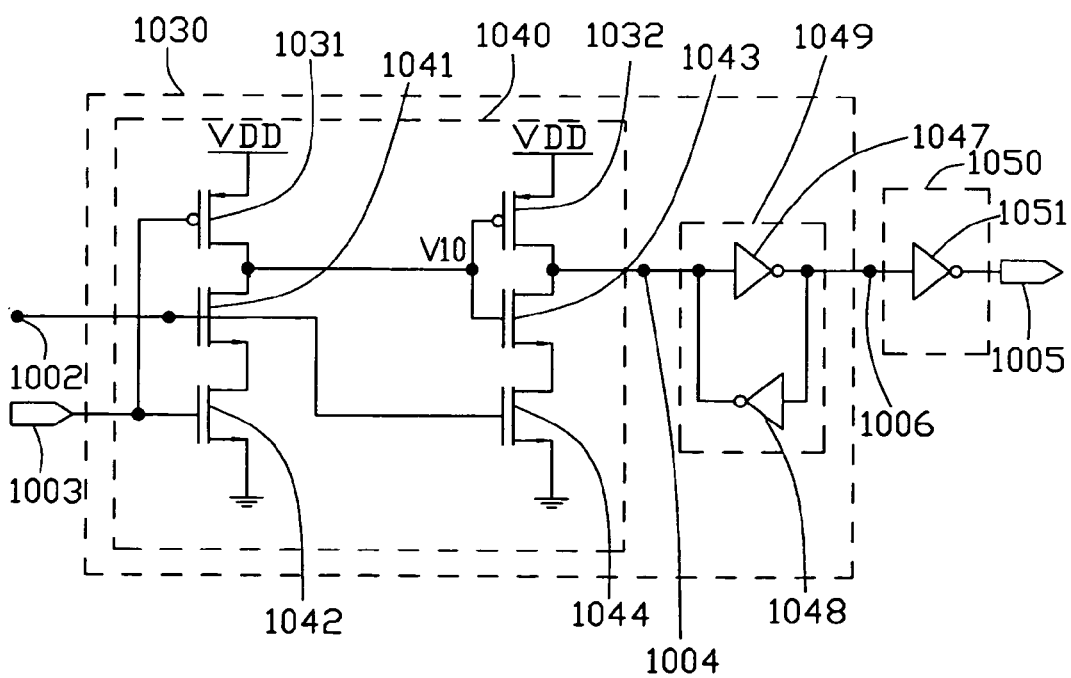
FIG. 8 is a circuit diagram of a fourth embodiment of the latch flip-flop of FIG. 1.

Referring to FIG. 8, this is a circuit diagram of the fourth embodiment of the latch flip-flop of FIG. 1. The latch flip-flop 1030 comprises a sample unit 1040 and a hold unit 1049. The sample unit 1040 comprises: two PMOS type transistors, which are a first PMOS type transistor 1031, and a second PMOS type transistor 1032; and four NMOS type transistors, which are a first NMOS type transistor 1041, a second NMOS type transistor 1042, a third NMOS type transistor 1043, and a fourth NMOS type transistor 1044. The hold unit 1049 includes a fifth inverter 1047 and a sixth inverter 1048.

The sources of the two PMOS type transistors 1031, 1032 are connected to a power source VDD. The gate of the first PMOS type transistor 1031 and the gate of the second NMOS type transistor 1042 are connected to the data input 1003. The gate of the first NMOS type transistor 1041 and the gate of the fourth NMOS type transistor 1044 are connected to the data input 1003. The node V10 is connected to the drain of the first PMOS type transistor 1031, the gate of the second PMOS type transistor 1032, the gate of the third NMOS type transistor 1043, and the drain of the first NMOS type transistor 1041. The source of the first NMOS type transistor 1041 is connected to the drain of the second NMOS type transistor 1042. The source of the third NMOS type transistor 1043 is connected to the drain of the fourth NMOS type transistor 1044. The source of the second NMOS type transistor 1042 and the source of the fourth NMOS type transistor 1044 are connected to ground (0 volts). The drain of the second PMOS type transistor 1032 and the drain of the third NMOS type transistor 1043 are connected to the hold unit 1049 via the node 1004. If the node 1002 is at low level, the first NMOS type transistor 1041 and the fourth NMOS type transistor 1044 would be placed in a non-conducting state. If the data input 1003 is at low level, the first PMOS type transistor 1031 would be placed in the conducting state and the second NMOS type transistor 1042 would be placed in the non-conducting state. That causes the node V10 to be successively charged to a high level. When the node V10 is at high level, the second PMOS type transistor 1032 is placed in a non-conducting state and the third NMOS type transistor 1044 is in a conducting state. Then, the hold unit 1049 holds the same data. If the data input 1003 is at high level, the first PMOS type transistor 1031 would be placed in a non-conducting state and the second NMOS type transistor 1042 would be placed in a conducting state. Because the first NMOS type transistor 1041 is in a non-conducting state, the node V10 is still at high level. The second PMOS type transistor 1032 is in a non-conducting state due to the high level of the node V10; as a result, the data in the hold unit 1049 is unchanged. Thus, no matter whether the data input is at high level or low level, the data in the hold unit will not be changed when the node 1002 is at low level. If the node 1002 changes from low level to high level, the first NMOS type transistor 1041 and the fourth NMOS type transistor 1044 would be placed in a conducting state. If the data input is at low level at that moment, the first PMOS type transistor 1031 would be placed in the conducting state and the second NMOS type transistor 1042 would be placed in a non-conducting state. The node V10 is successively charged to a high level. Due to the high level of the node V10, the second NMOS type transistor 1042 would be placed in a non-conducting state and the third NMOS type transistor would be placed in a conducting state. The fourth NMOS type transistor 1044 is in a conducting state at that moment. According to the above, the hold unit 1049 is connected to ground through the node 1004, the third NMOS type transistor 1043, and the fourth NMOS type transistor 1044. The equivalent is to output a low voltage to the hold unit 1049. If the data input 1003 is at high level, the first PMOS type transistor 1031 would be placed in a non-conducting state and the second NMOS type transistor 1042 would be placed in a conducting state. The node V10 is connected to ground via the first NMOS type transistor 1041 and the second NMOS type transistor 1042. Thus, the fourth NMOS type transistor 1044 is placed in a non-conducting state and the second PMOS type transistor 1032 is in a conducting state. The node 1004 is successively charged to a high level, and outputs the high voltage to the hold unit 1049 through the second PMOS type transistor 1032. The positive edge of the clock signal would trigger the sample unit 1040, and then the data signal from the data input 1003 is sampled. The hold unit 1049 receives the sampled data signal from the sample unit 1040 via the node 1004. Before the next data are sampled, the hold unit 1049 inverts and holds the sampled data, and then outputs the sampled data to the buffer unit 1050 via the node 1006.

The buffer unit 1050 includes a seventh inverter 1051, which is used for inverting the inverted sampled data from the latch flip-flop 1030 and the node 1006. Then, the inverted sampled data are transformed to the original sampled data. The buffer unit 1050 outputs the sampled data to the node 1005. That means the buffer unit 1050 can provide the function of buffering the output data, and provide the higher driving force to the following circuit.

Figure 9:
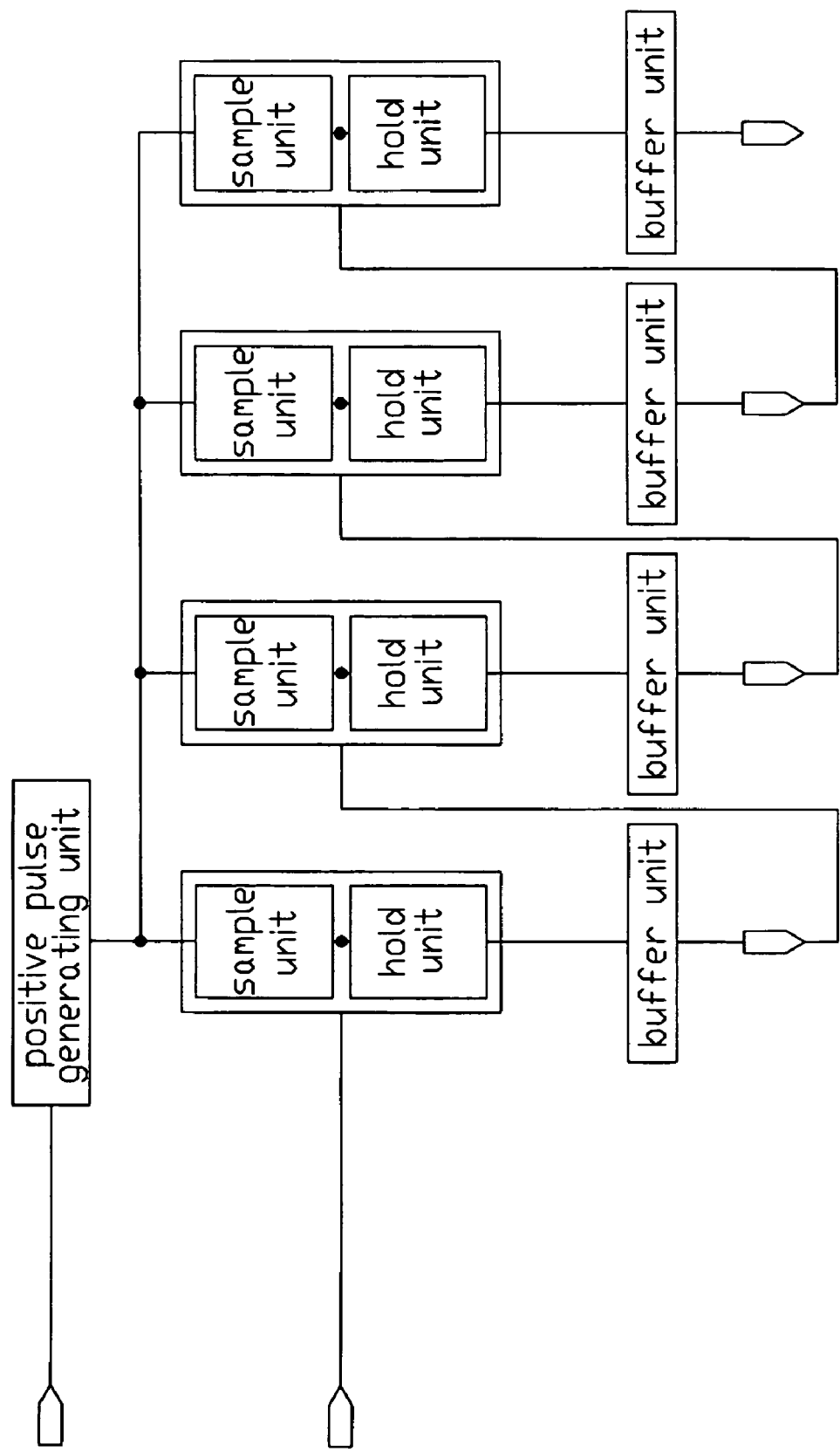
FIG. 9 is a block diagram of the HLFF applied in an LCD driving circuit according to the present invention.
Figure 11:
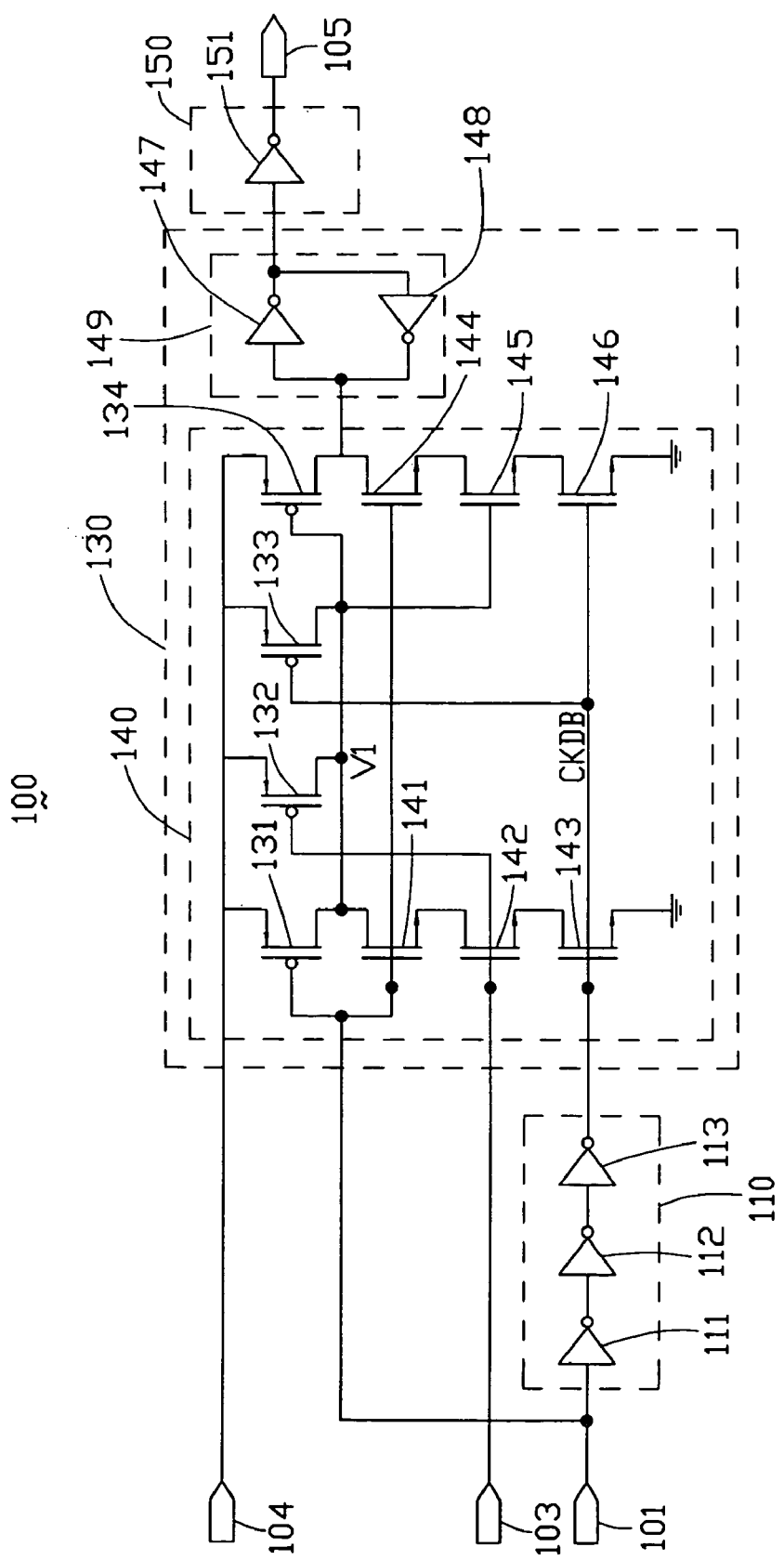
FIG. 11 is a block diagram of a hybrid latch flip-flop disclosed in the prior art.
Figure 12:
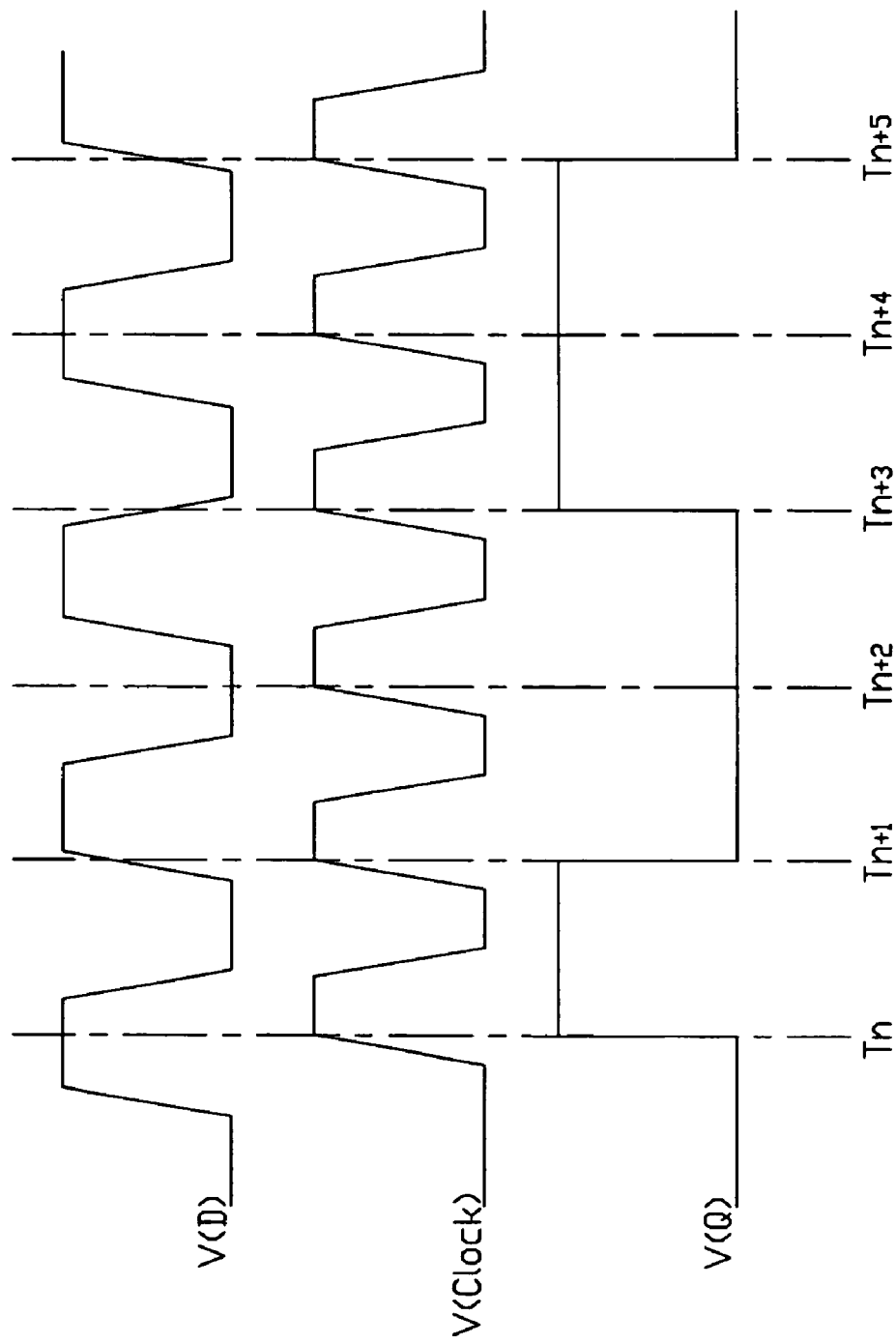
FIG. 12 is a sequence diagram of the hybrid latch flip-flop of FIG. 11.

The sample units 740 and 840 described above each include seven MOS type transistors, and the sample units 940 and 1040 described above each include six MOS type transistors. Compared to the sample unit 140 of FIG. 11, which has ten MOS type transistors, the sample unit according to the present invention has lower power consumption. Although the number of transistors of the positive pulse generating unit of the present invention is more than the number of transistors of the inverter unit of FIG. 1, the positive pulse generating unit and the latch flip-flop according to the present invention can be separated to let the positive pulse generating unit be the common circuit in the driving circuit. Referring to FIG. 9, this is a block diagram of the HLFF applied in an LCD driving circuit according to the present invention. The positive pulse generating unit is the common circuit in the LCD driving circuit, therefore the increase in the number of transistors from the positive pulse generating unit will not cause increased power consumption of the total driving circuit. Thus, the HLFF according to the present invention achieves the object of having lower power consumption than the prior art.

Figure 10:
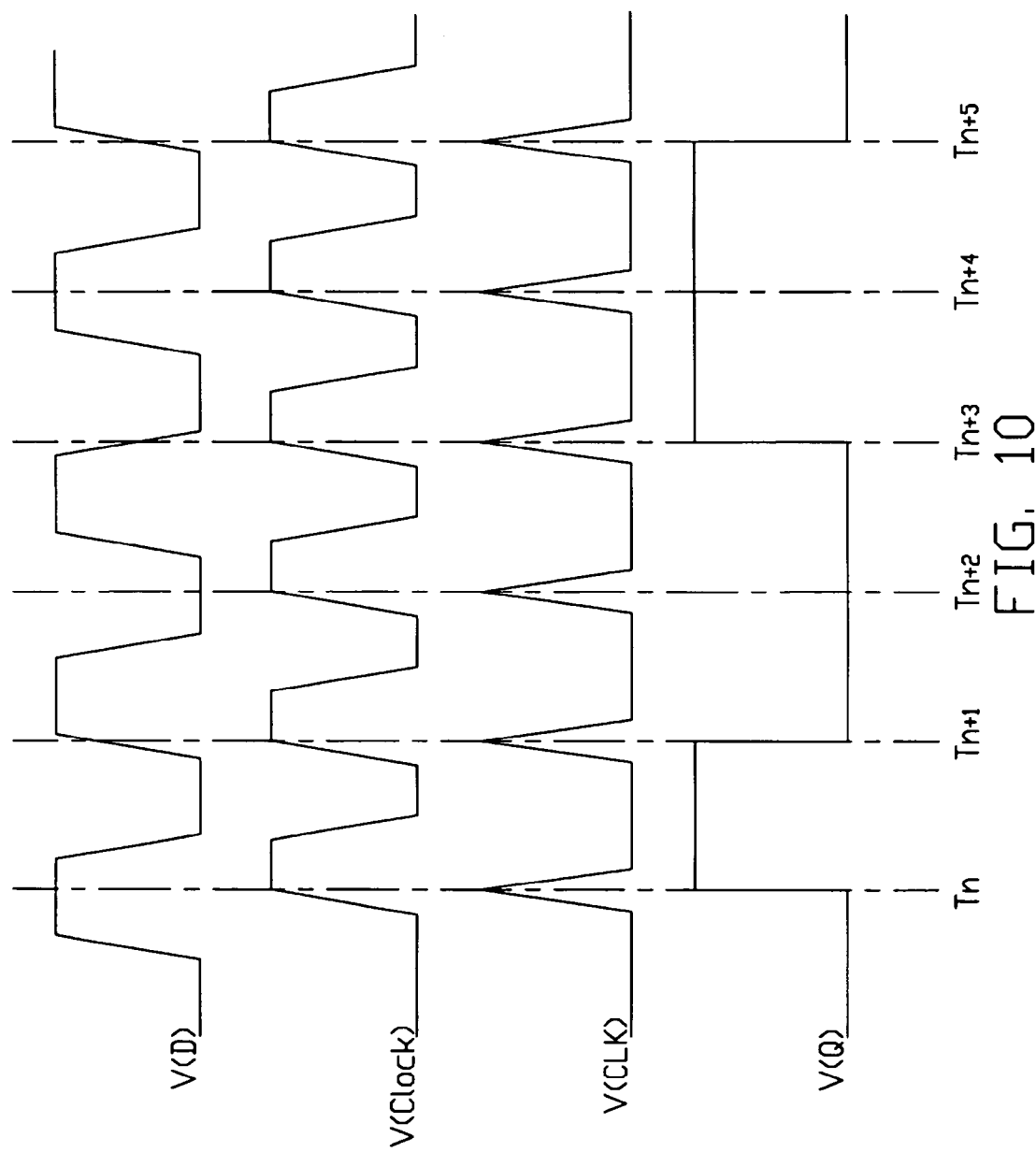
FIG. 10 is a sequence diagram of the hybrid latch flip-flop of FIG. 1.

Referring to FIG. 10, this is a sequence diagram of the hybrid latch flip-flop of FIG. 1. In FIG. 10, V(D) represents the waveform diagram of the data input 303, V(Clock) represents the waveform diagram of the clock input 301, V(CLK) represents the waveform diagram of the pulse input 302, and V(Q) represents the waveform diagram of the data output 305. V(CLK) is generated by the positive pulse generating unit of FIG. 4. As shown in FIG. 10, V(CLK) and V(Clock) are at low level before clock time Tn. When the positive edge of V(Clock) arrives at Tn, V(CLK) generates a positive pulse and V(D) is sampled. Because V(D) is at high level, V(Q) changes from low to high level. Before Tn+1, V(D) is at low level, and V(Q) is at high level. At Tn+1, another positive edge of V(Clock) arrives, and V(CLK) generates another positive pulse and V(D) is sampled. Because V(D) is at low level, V(Q) changes from high to low level. For this reason, at Tn+2, because V(D) is at low level, V(Q) remains at low level. At Tn+3, because V(D) is at high level, V(Q) changes from low to high level. At Tn+4, because V(D) is at high level, V(Q) remains at high level. At Tn+5, because V(D) is at low level, V(Q) changes from high to low level. Although the embodiments described above are applied in the LCD driving circuit, people skilled in the art would know that the present invention can be applied in many fields according to the disclosure above. The present invention should not be limited to the LCD driving circuit.

It is to be further understood that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A hybrid latch flip-flop, comprising:
   a positive pulse generating unit;
   a clock input connected to the positive pulse generating unit for applying clock signals to the positive pulse generating unit;
   a latch flip-flop connected to the positive pulse generating unit, the latch flip-flop comprising a sample unit and a hold unit, an output of the sample unit connected to the bold unit;
   a buffer unit connected to the hold unit;
   a data input unit connected to an input of the sample unit for applying input data signals to the sample unit; and a data output connected to the buffer unit for outputting output data signals;

wherein the sample unit comprises: three PMOS type transistors, which are a first PMOS type transistor, a second PMOS type transistor, and a third PMOS type transistor; and four NMOS type transistors, which are a first NMOS type transistor, a second NMOS type transistor, a third NMOS type transistor, and a fourth NMOS type transistor, the sources of the three PMOS type transistors being connected to a power source, the gate of the first PMOS type transistor, the gate of the second NMOS type transistor, and the gate of the fourth NMOS type transistor all being connected to an output of the positive pulse generating unit, the gate of the first NMOS type transistor the gate of the second PMOS type transistor being both connected to the data input unit, a node being connected to the drain of the first PMOS type transistor, the drain of the second PMOS type transistor, the gate of the third PMOS type transistor, the gate of the third NMOS type transistor, and the drain of the first NMOS type transistor, the source of the first NMOS type transistor being connected to the drain of the second NMOS type transistor, the source of the third NMOS type transistor being connected to the drain of the fourth NMOS type transistor, the source of the second NMOS type transistor and the source of the fourth NMOS type transistor being connected to ground, the drain of the third PMOS type transistor and the drain of the third NMOS type transistor being connected to the hold unit.

2. The hybrid latch flip-flop of claim 1, wherein the positive pulse generating unit is a positive edge trigger type.

3. The hybrid latch flip-flop of claim 1, wherein the negative pulse generating unit is a negative edge trigger type.

4. The hybrid latch flip-flop of claim 1, wherein the positive pulse generating unit is a double-edge trigger type.

5. A hybrid latch flip-flop, comprising:
a positive pulse generating unit;
a clock input connected to the positive pulse generating unit for applying clock signals to the positive pulse generating unit;
a latch flip-flop connected to the positive pulse generating unit, the latch flip-flop comprising a sample unit and a hold unit, an output of the sample unit connected to the hold unit;
a buffer unit connected to the hold unit;
a data input unit connected to an input of the sample unit for applying input data signals to the sample unit; and
a data output connected to the buffer unit for outputting output data signals;
wherein the sample unit comprises: three PMOS type transistors, which are a first PMOS type transistor, a second PMOS type transistor, and a third PMOS type transistor; and four NMOS type transistors, which are a first NMOS type transistor, a second NMOS type transistor, a third NMOS type transistor, and a fourth NMOS type transistor, the sources of the three PMOS type transistors being connected to a power source, the gate of the first PMOS type transistor and the gate of the second NMOS type transistor being connected to the data input unit, the gate of the first NMOS type transistor, the gate of the second PMOS type transistor, and the gate of the third NMOS type transistor are connected to an output of the positive pulse generating unit, a node being connected to the drain of the first PMOS type transistor, the drain of the second PMOS type transistor, the gate of the third PMOS type transistor, the gate of the third NMOS type transistor, and the drain of the first NMOS type transistor, the source of the first NMOS type transistor being connected to the drain of the second NMOS type transistor, the source of the third NMOS type transistor being connected to the drain of the fourth NMOS type transistor, the source of the second NMOS type transistor and the source of the fourth NMOS type transistor being connected to ground, the drain of the third PMOS type transistor and the drain of the third NMOS type transistor being connected to the hold unit.

6. The hybrid latch flip-flop of claim 5, wherein the positive pulse generating unit is a positive edge trigger type.

7. The hybrid latch flip-flop of claim 5, wherein the negative pulse generating unit is a negative edge trigger type.

8. The hybrid latch flip-flop of claim 5, wherein the positive pulse generating unit is a double-edge trigger type.

9. A hybrid latch flip-flop, comprising:
a positive pulse generating unit;
a clock input connected to the positive pulse generating unit for applying clock signals to the positive pulse generating unit;
a latch flip-flop connected to the positive pulse generating unit, the latch flip-flop comprising a sample unit and a hold unit, an output of the sample unit connected to the hold unit;
a buffer unit connected to the hold unit;
a data input unit connected to an input of the sample unit for applying input data signals to the sample unit; and
a data output connected to the buffer unit for outputting output data signals;
wherein the sample unit comprises two PMOS type transistors, which are a first PMOS type transistor and a second PMOS type transistor; and four NMOS type transistors, which are a first NMOS type transistor, a second NMOS type transistor, a third NMOS type transistor, and a fourth NMOS type transistor, the sources of the two PMOS type transistors being connected to a power source, the gate of the first PMOS type transistor, the gate of the first NMOS type transistor, and the gate of the third NMOS type transistor being connected to an output of the positive pulse generating unit, the gate of the second NMOS type transistor being connected to the data input, a node being connected to the drain of the first PMOS type transistor, the gate of the second PMOS type transistor, the gate of the fourth NMOS type transistor, and the drain of the first NMOS type transistor, the source of the first NMOS type transistor being connected to the drain of the second NMOS type transistor, the source of the third NMOS type transistor being connected to the drain of the fourth NMOS type transistor, the source of the second NMOS type transistor and the source of the fourth NMOS type transistor being connected to ground, the drain of the second PMOS type transistor and the drain of the third NMOS type transistor being connected to the hold unit.

10. The hybrid latch flip-flop of claim 9, wherein the positive pulse generating unit is a positive edge trigger type.

11. The hybrid latch flip-flop of claim 9, wherein the negative pulse generating unit is a negative edge trigger type.

12. The hybrid latch flip-flop of claim 9, wherein the positive pulse generating unit is a double-edge trigger type.

* * * * *